United States Patent
Bickerstaff et al.

(10) Patent No.: US 8,196,006 B2
(45) Date of Patent: Jun. 5, 2012

(54) MODIFIED BRANCH METRIC CALCULATOR TO REDUCE INTERLEAVER MEMORY AND IMPROVE PERFORMANCE IN A FIXED-POINT TURBO DECODER

(75) Inventors: Mark Andrew Bickerstaff, Calingford (AU); Benjamin John Widdup, Glenwood (AU)

(73) Assignee: Agere Systems, Inc., Allentown, PA (US)

( * ) Notice: Subject to any disclaimer, the term of this patent is extended or adjusted under 35 U.S.C. 154(b) by 836 days.

(21) Appl. No.: 12/323,558

(22) Filed: Nov. 26, 2008

(65) Prior Publication Data
US 2009/0077330 A1    Mar. 19, 2009

Related U.S. Application Data

(62) Division of application No. 11/212,186, filed on Aug. 26, 2005, now Pat. No. 7,464,316.

(51) Int. Cl.
*H03M 13/00* (2006.01)
(52) U.S. Cl. ......................................... 714/755; 714/774
(58) Field of Classification Search .................. 714/755, 714/774
See application file for complete search history.

(56) References Cited

U.S. PATENT DOCUMENTS

| 4,835,772 A | 5/1989 | Peile et al. ..................... 714/762 |
| 5,559,831 A | 9/1996 | Keith ............................. 375/240 |
| 5,771,244 A | 6/1998 | Reed et al. ..................... 714/752 |
| 6,205,256 B1 | 3/2001 | Chaddha ....................... 382/253 |
| 6,252,917 B1 | 6/2001 | Freeman ....................... 375/340 |
| 6,725,409 B1 | 4/2004 | Wolf ............................. 714/755 |
| 6,785,859 B2 | 8/2004 | Goldman ..................... 714/755 |
| 6,868,518 B2 | 3/2005 | Yuan et al. .................... 714/759 |
| 6,892,335 B2 | 5/2005 | Gueguen ...................... 714/701 |
| 7,120,851 B2 | 10/2006 | Ting et al. .................... 714/755 |
| 2002/0010894 A1* | 1/2002 | Wolf et al. .................... 714/793 |
| 2004/0039769 A1* | 2/2004 | Orio ............................. 708/530 |
| 2004/0083252 A1* | 4/2004 | Ting et al. .................... 708/530 |
| 2004/0240590 A1* | 12/2004 | Cameron et al. .............. 375/340 |
| 2005/0021555 A1* | 1/2005 | Cameron et al. .............. 707/102 |
| 2005/0022090 A1* | 1/2005 | Cameron et al. .............. 714/755 |

OTHER PUBLICATIONS

Claussen et al.; "Improved Max-Log Map Turbo Decoding Using Maximum Mutual Information Combining"; The 14th IEEE 2003 International Symposium on Personal, Indoor and Mobile Radio Communication Proceedings.

* cited by examiner

*Primary Examiner* — M. Mujtaba K Chaudry

(57) ABSTRACT

A turbo decoder that calculates alpha, beta and gamma (branch metric) values does not normalize the branch metric but instead applies the normalization factor to the newly calculated extrinsic values before writing them to interleaving memory, resulting in use of less memory than in prior turbo decoders. A compensating factor is applied when the extrinsics are read from interleaving memory. The absence of normalization in the gamma calculation not only conserves memory but also enhances decoder sensitivity.

4 Claims, 4 Drawing Sheets

MODIFIED BRANCH METRIC CALCULATOR TO REDUCE INTERLEAVER MEMORY AND IMPROVE PERFORMANCE IN A FIXED-POINT TURBO DECODER

CROSS-REFERENCE TO RELATED APPLICATIONS

This application is a divisional application of application Ser. No. 11/212,186, which has been allowed but has not yet issued. This application claims priority to and the benefit of the filing date of application Ser. No. 11/212,186, which is incorporated herein by reference in its entirety.

TECHNICAL FIELD OF THE INVENTION

The invention relates to encoding and decoding digital information and, more specifically, to an improved fixed-point turbo coding method and apparatus.

BACKGROUND OF THE INVENTION

Turbo coding is a type of error correcting coding used in communication systems. Turbo coding has been shown to allow the operation of communication channels closer to the theoretical Shannon limit than prior coding schemes. Prior to the development of turbo coding, the most powerful error correcting coding was performed by convolutional encoders and Viterbi decoders or using block codes (e.g., Reed-Solomon codes). In its most basic form, turbo encoding uses two parallel convolutional encoders, referred to as "constituent encoders," with some form of interleaving in between them. The channel data comprises the bit stream describing the original information, the parity bits generated by the first constituent encoder, and the parity bits generated by the second constituent encoder.

Turbo decoding, like the decoding of other types of error correcting codes, involves making decisions based upon codeword probabilities. Turbo decoding is a type of iterative soft-decision decoding, in which the decoder is provided with extrinsic information indicating a measure of confidence for the decision. A conceptual structure of a turbo decoder 100 is illustrated in FIG. 1. Turbo decoder 100 includes two soft-input soft-output (SISO) decoders 102 and 104, coupled in a cyclic topology with interleaver memory 106 (sometimes referred to by the symbol "$\pi$") and de-interleaver memory 108 (sometimes referred to by the symbol "$\pi^{-1}$"). The iterative nature of turbo decoder operation can be described in terms of half-iterations. A half-iteration can be defined as the work done by one of SISO decoders 102 and 104 reading from one of interleaver and de-interleaver memories 106 and 108, processing the received block of code symbols, and writing the results into the other of de-interleaver and interleaver memories 108 and 106, respectively. The overall decoding process consists of many half-iterations.

Each SISO decoder 102 and 104 is provided with channel observations, processes the channel observations in accordance with an algorithm or processing method, and outputs soft information in the form of a log likelihood ratio that can be used to make a hard decision about the received information or can be used for further processing. The soft information is probability data for the received information that provides an indication of the confidence that is to be attributed to the value of the received information. For example, if the received information was decoded to be a "0" bit, the soft information associated with that received information gives an indication of the likelihood that the original information (before coding) was indeed a "0" bit. The SISO decoder also generates additional soft information as it is processing the input information; the difference between the additional generated soft information and the soft information at the input is called extrinsic information. In many applications where a SISO decoder is used, the extrinsic information is recursively inputted as soft input information to allow the SISO to generate more reliable soft information about particular received information.

The channel observations with which SISO decoders 102 and 104 are provided include the systematic ($R_s$) and parity bit ($R_p$) samples that are part of the received codeword information block. The logMAP (Maximum A Posteriori) algorithm is perhaps the most commonly used algorithm under which SISO decoders 102 and 104 operate. In a turbo decoder in which they operate under the logMAP algorithm, they are generally referred to as logMAP processors. The logMAP algorithm is a recursive algorithm for calculating the probability of a processing device being in a particular state at a given time based on received information. The probabilities are calculated by forward recursions and backward recursions over a defined time window or a block of information. The logMAP algorithm essentially is the recursive calculation of probabilities of being in certain states based on received information and the a priori probabilities of going to specific states from particular states. The states describe the condition of a process that generates the information that is ultimately received.

The logMAP algorithm and how a logMAP processor operates are often represented by a trellis diagram having a certain number of states. Each state has a probability associated with it and transition probabilities indicating the likelihood of transitioning from one state to another state either forward or backward in time. In general, each state in a trellis has a number of transition probabilities entering it and leaving it. The number of probabilities entering or leaving states of a trellis is referred to as the radix. Thus, in a Radix-2 trellis, each state has two entering and two exiting transition probabilities. The trellis shows the possible transition between states over time. In general, a Radix-K trellis has K branches entering and K branches leaving each state in the trellis. The output of the logMAP algorithm is called the LLR (Log Likelihood Ratio), which represents the probability that the original information (i.e., information prior to exposure to any noisy environment and prior to any processing) was a certain value. For example, for digital information, the LLR represents the probability that the original information was either a "0" bit or a "1" bit given all of the received data or observations.

The logMAP algorithm is typically implemented by performing forward and backward recursions over the trellis. The probabilities of each state in the trellis in the forward direction, known as alpha ("$\alpha$") values, are determined in the forward recursion. The probabilities of each state in the trellis in the reverse direction, known as beta ("$\beta$") values, are determined in the backward recursion. Each branch in the trellis has a transition probability associated with its connection from one state to the next, and this is known as the branch metric or gamma ("$\gamma$"). The gamma values are calculated during each of the forward and backward recursions.

The logMAP turbo decoding process can be summarized in the form of the following sequence of steps or equations, well-known to practitioners in the art:

(1A) Read ("old") extrinsic value from a previous half-iteration from interleaver memory:

$$L_{ext}^{old} = \text{read(INTERLEAVER)}$$

(2A) Compute the branch metrics for all branches in the trellis:

$$\gamma = \frac{1}{2}[(R_s = L_{ext}^{old}) \times E_s + R_p \times E_p],$$

where $E_s$ and $E_p$ represent the expected systematic and parity bits for the transition.

(3A) Perform a forward recursion on the trellis by computing an alpha value for each trellis node:
$\alpha_t^{\phi(t)} = \text{logsum}(\alpha_{t-1}^{\phi(t-1)} + \gamma_t^0, \alpha_{t-1}^{\phi'(t-1)} + \gamma_t^1)$, where $\phi(t-1)$ and $\phi'(t-1)$ represent the source trellis state transitioning to destination state $\phi(t)$ for a "0" and "1" bit, respectively.

(4A) Perform a backward recursion on the trellis by computing a beta value for each trellis node:
$\beta_t^{\phi(t)} = \text{logsum}(\beta_{t+1}^{\phi(t+1)} + \gamma_t^0, \beta_{t+1}^{\phi'(t+1)} + \gamma_t^1)$ (5A) Compute the log likelihood (LL) for each time t for "0" bit:

$$LL_t^0 = \underset{i=0}{\overset{N-1}{\text{logsum}}}(\alpha_t^{\varphi(t)} + \gamma_t^0 + \beta_{t+1}^{\varphi(t+1)}),$$

where N is the number of states in the trellis.

(6A) Compute the log likelihood (LL) for each time t for "1" bit:

$$LL_t^1 = \underset{i=0}{\overset{N-1}{\text{logsum}}}(\alpha_t^{\varphi'(t)} + \gamma_t^1 + \beta_{t+1}^{\varphi'(t+1)})$$

(7A) Compute the log likelihood ratio (LLR):
$LLR = LL_t^1 - LL_t^0$ (8A) Compute the extrinsic value to be fed to the next half-iteration:
$L_{ext}^{new} = LLR - L_{ext}^{old}$ (9A) Store new extrinsic value in interleaver memory:
store(INTERLEAVER, $L_{ext}^{new}$)

(10A) Test to determine whether to terminate the iterative process. If the iteration limit is reached, or if a test for early termination passes, then stop the iterative process, as this indicates the block has been sufficiently decoded.

(11A) If the iterative process is not yet terminated, then repeat the above-listed Steps 1A-10A, with iterations alternating between a linear addressing mode and an interleaved addressing mode.

Practitioners in the art have constructed and made commercially available turbo decoders that implement the above-described method. It can be appreciated that the interleaver memory in such turbo decoders may need to store several thousand extrinsic values, as there is one extrinsic value per information bit represented in the code block. An important objective in chip design is to conserve resources such as the amount of memory. The present invention addresses memory conservation and other problems, such as, for example, quantization loss in the branch metric calculations, etc., in the manner described below.

SUMMARY OF THE INVENTION

The present invention relates to coding of the type generally referred to in the art as turbo coding. In an exemplary embodiment of the invention, a turbo decoder comprises: an interleaver for storing extrinsic values during the iterative decoding process; alpha, beta and gamma logic for respectively calculating alpha, beta and gamma trellis probability values, wherein the gamma logic produces non-normalized branch metric (gamma) values; log-likelihood logic for calculating log-likelihood ratios in response to the trellis probabilities; extrinsic value calculation logic for providing newly calculated extrinsic values in response to the difference of the log-likelihood ratios and previously calculated extrinsic values read from interleaver memory, wherein the inverse of a normalization factor is applied to the previously calculated extrinsic values before calculating the difference, and wherein a normalization factor is applied to the newly calculated extrinsic values before being written to interleaver memory; and decision logic for deciding bit states in response to corresponding log-likelihood ratios. The turbo decoder can also include suitable control logic for receiving an input symbol block, controlling the above-listed decoding logic elements and iterative decoding process, and outputting the decoded bit stream. The absence of normalization in the branch metric calculation and corresponding placement of the normalization factor elsewhere in the calculations means that the calculated extrinsic values occupy significantly less memory space in the interleaver than in prior turbo decoders. Furthermore, the absence of normalization in the branch metric calculation also advantageously increases decoder sensitivity to some extent, which improves the decoding performance of the decoder.

DETAILED DESCRIPTION OF A PREFERRED EMBODIMENT

Figure 1:
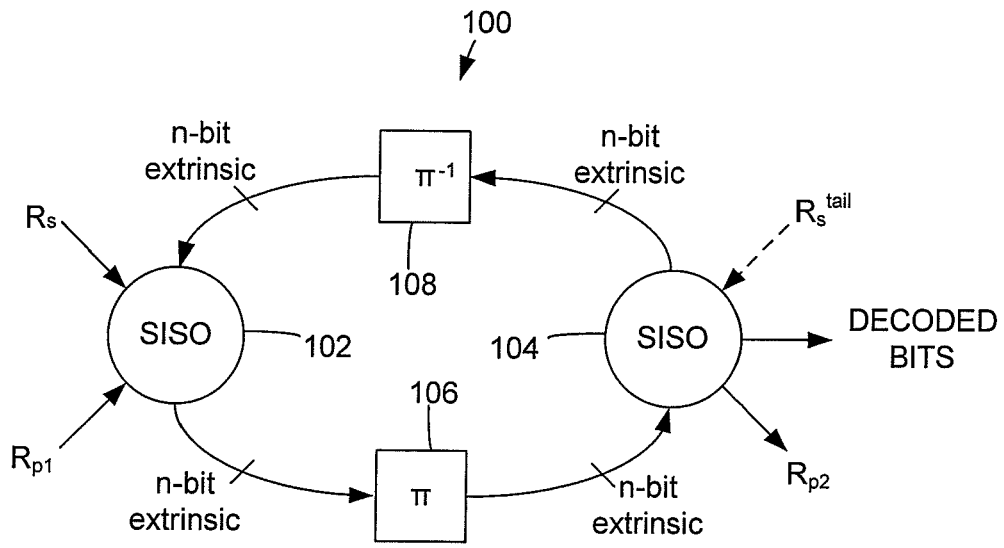
FIG. 1 is a conceptual diagram of a prior art turbo decoder.
Figure 2:
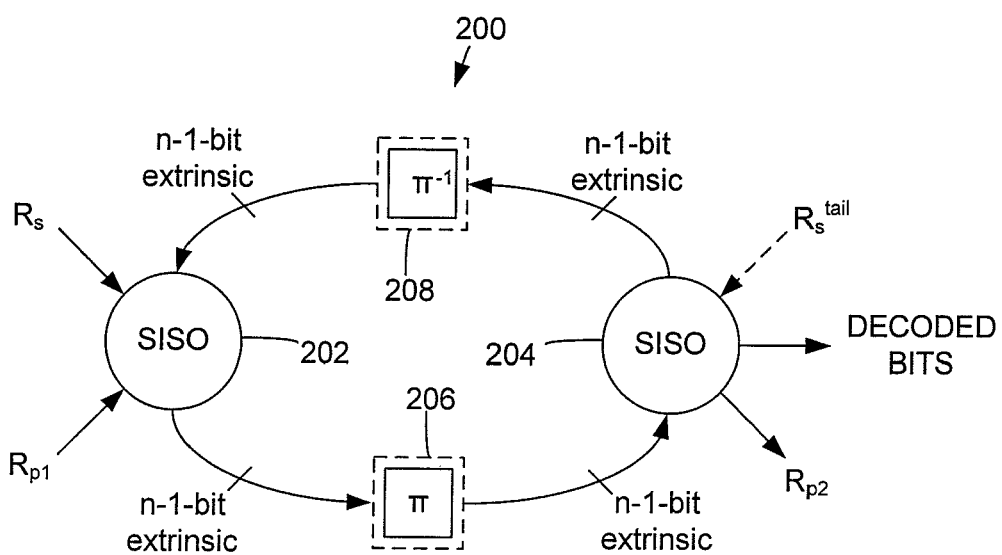
FIG. 2 is a conceptual diagram of a turbo decoder in accordance with an exemplary embodiment of the present invention.

A turbo decoder 200 in accordance with the present invention is illustrated in FIG. 2. Turbo decoder 200 includes two soft-input soft-output (SISO) decoders 202 and 204 coupled with interleaver and de-interleaver memories 206 and 208, respectively, that collectively can provide a smaller amount of storage than those in prior turbo decoders such as that illustrated in FIG. 1. Memories 206 and 208 can be smaller than those of prior turbo decoders (as conceptually indicated in dashed line) because SISO decoders 202 and 204 store extrinsic values in them having fewer bits than do the SISO decoders (e.g., 102 and 104) of prior turbo decoders. As described in further detail below, the extrinsic values that are stored have been divided by two, in effect removing the least-significant bit, and thereby reducing memory requirements by one bit per extrinsic value. Thus, the invention reduces memory requirements without compromising decoding performance because compensating factors are applied elsewhere in the algorithm. In addition, as described below, decoding performance is not only not compromised, but in at least one aspect, namely, sensitivity, performance is actually enhanced somewhat over that of prior fixed-point turbo decoders.

The turbo decoding method of the present invention can be described in terms of the following sequence of steps:

(1B) Read extrinsic value from a previous half-iteration from interleaver memory:

$$L_{ext}^{old} = \text{read(INTERLEAVER)}$$

As described below, the extrinsic values that have been stored in interleaver memory and subsequently read from interleaver memory in the above-referenced Step 1B are one bit smaller than the extrinsic values stored and read in prior turbo decoders. Note that the interleaver memory referred to in mathematical or pseudo-code format in the above-referenced Step 1B as "INTERLEAVER" can be smaller than the corresponding interleaver memory used in prior turbo decoders.

(2B) Compute the branch metrics for all branches in the trellis:

$$\gamma = [(R_s + L_{ext}^{old}) \times E_s + R_p \times E_p]$$

Note that the branch metric is non-normalized. That is, the quantity within the square brackets is not divided by two as in Step 2A of the above-described prior turbo decoding method. In the prior method, the final divide-by-two reflects a normalization of the probability. A side-effect of this normalization, however, is quantization loss which, in turn means is that the sensitivity of the prior decoding process to the systematic bit ($R_s$) and parity bit ($R_p$) samples is inherently impacted. The present invention eliminates this impact upon decoding sensitivity by removing the divide-by-two from the branch metric (gamma) calculation and compensating for the removal elsewhere in the calculations, as described below.

(3B) Perform a forward recursion on the trellis by computing an alpha value for each trellis node:

$$\alpha_t^{\phi(t)} = \text{logsum}(\alpha_{t-1}^{\phi(t-1)} + \gamma_t^0, \alpha_{t-1}^{\phi'(t-1)} + \gamma_t^1)$$

(4B) Perform a backward recursion on the trellis by computing a beta value for each trellis node:

$$\beta_t^{\phi(t)} = \text{logsum}(\beta_{t+1}^{\phi(t+1)} + \gamma_t^0, \beta_{t+1}^{\phi'(t+1)} + \gamma_t^1)$$

(5B) Compute the log likelihood (LL) for each time t for "0" bit:

$$LL_t^0 = \underset{i=0}{\overset{N-1}{\text{logsum}}} \left( \alpha_t^{\phi(t)} + \gamma_t^0 + \beta_{t+1}^{\phi(t+1)} \right)$$

(6B) Compute the log likelihood (LL) for each time t for "1" bit:

$$LL_t^1 = \underset{i=0}{\overset{N-1}{\text{logsum}}} \left( \alpha_t^{\phi'(t)} + \gamma_t^1 + \beta_{t+1}^{\phi'(t+1)} \right)$$

(7B) Compute the log likelihood ratio (LLR):

$$LLR = LL_t^1 - LL_t^0$$

(8B) Compute the new extrinsic value to be fed to the next half-iteration:

$$L_{ext}^{new} = LLR - L_{ext}^{old} \times 2$$

(9B) Store new extrinsic value in interleaver memory:

$$\text{store}\left(\text{INTERLEAVER}, \frac{L_{ext}^{new}}{2}\right)$$

(10B) Test for whether to terminate the iterative process. If the iteration limit is reached, or if a test for early termination passes, then stop the iterative process, as this indicates the block has been decoded or the process should be discontinued for other reasons.

(11B) If the iterative process is not yet terminated, then repeat the above-listed Steps 1B-10B, with iterations alternating between a linear addressing mode and an interleaved addressing mode.

Note in Step 8B that the old extrinsic value is multiplied by two before being subtracted from the log likelihood ratio. Multiplying by two compensates for the extrinsic values having previously been halved, before storage into the interleaver memory during the previous half-iteration. The multiply-by-two returns the stored old extrinsic value to its original magnitude, as the least significant bit of the original value is lost after halving and multiplying by two. With prior turbo decoders typically storing several thousand extrinsic values of, for example, six bits each, reducing each memory location by one bit in accordance with the present invention can reduce total interleaver memory requirements by several thousand bits or, in a typical turbo decoder embodiment, approximately 16 percent.

Figure 3:
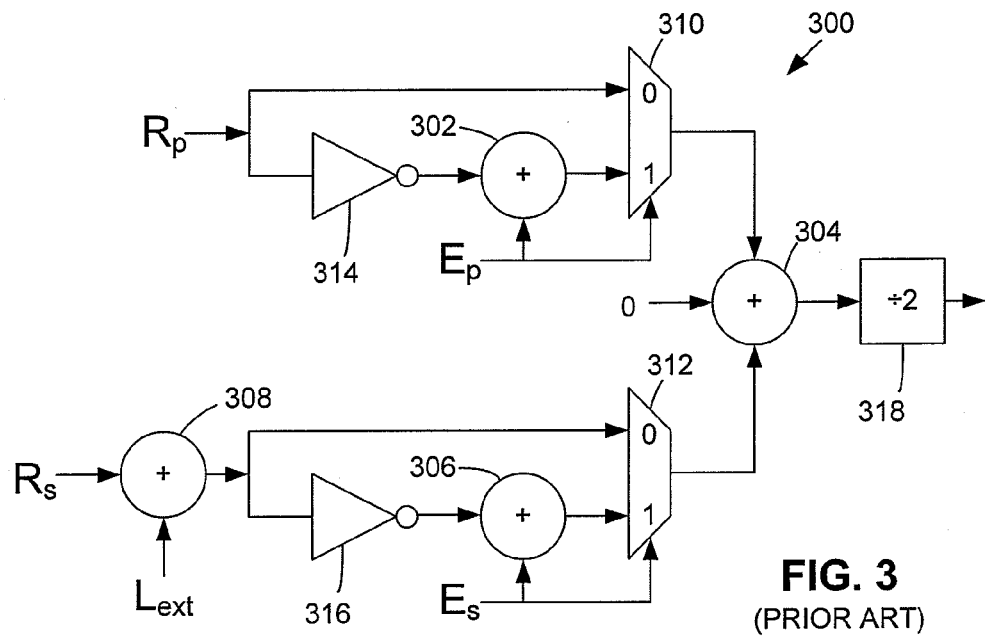
FIG. 3 is a block diagram of a prior art branch metric logic circuit.

As illustrated in FIG. 3, the branch metric calculation logic 300 of the prior turbo decoder performs or effects the above-noted Step 2A. It comprises four adders 302, 304, 306 and 308, two selectors 310 and 312, two inverters 314 and 316, and divide-by-two logic 318. Note that divide-by-two logic 318 drops the least-significant bit, reducing the size of the result by one bit.

Figure 4:
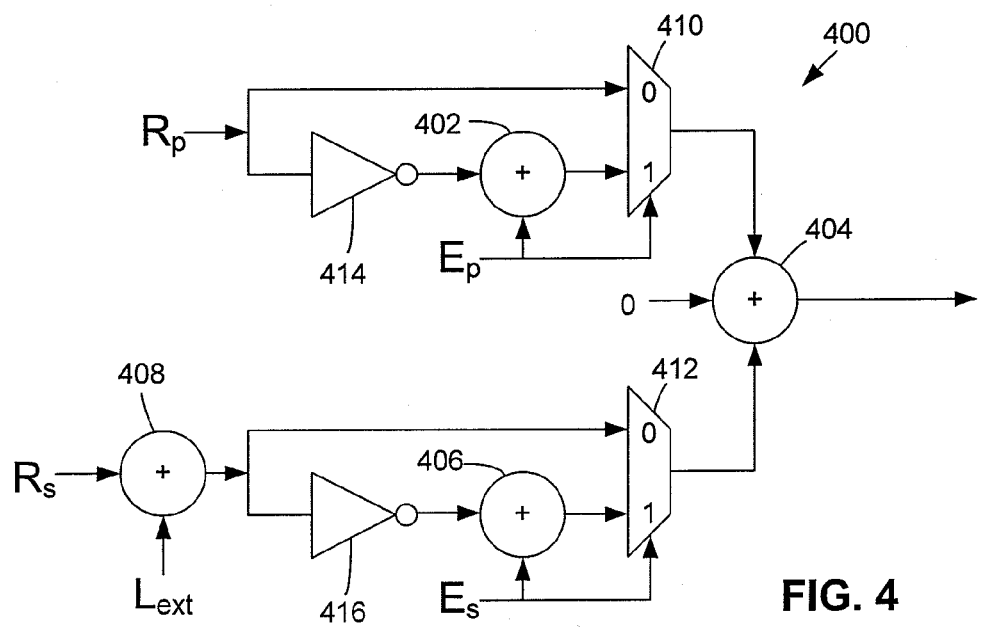
FIG. 4 is a block diagram of a branch metric logic circuit in accordance with the exemplary embodiment of the present invention.

As illustrated in FIG. 4, the branch metric calculation logic 400 of a turbo decoder in accordance with the present invention performs the above-noted Step 2B. It comprises four adders 402, 404, 406 and 408, two selectors 410 and 412, and two inverters 414 and 416. As described below, there is logic elsewhere in the turbo decoder that compensates for the absence of a final divide-by-two at the output of this branch metric calculation logic 400.

Figure 5:
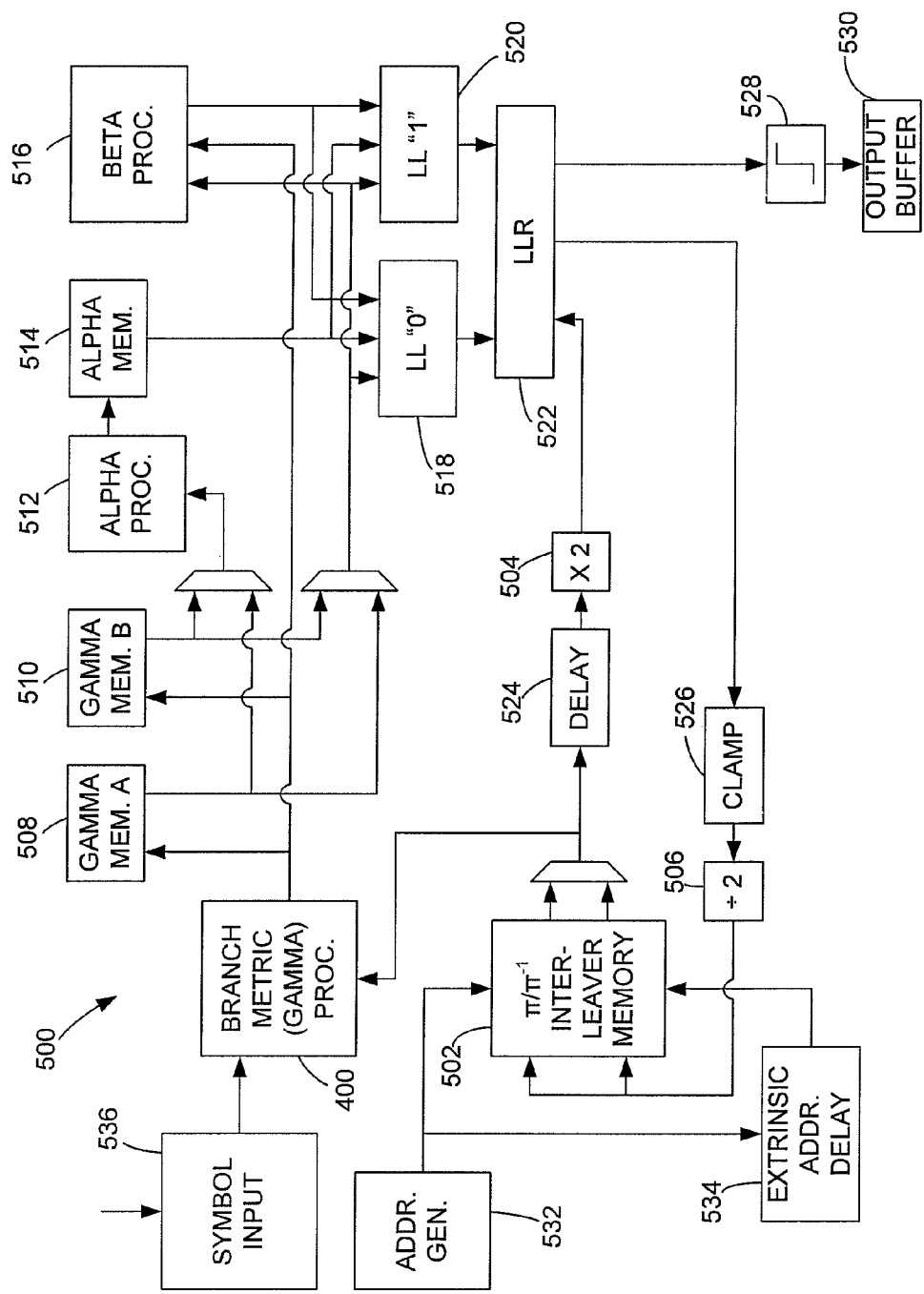
FIG. 5 is a block diagram of a turbo decoder architecture in accordance with an exemplary embodiment of the present invention.

Logic and other elements that compensate for the absence of the final divide-by-two operation in the branch metric (gamma) calculation logic 400 can be seen in FIG. 5, which illustrates essentially the entire turbo decoder 500. The term "logic" is used in this patent specification to broadly refer to circuits, processors and associated memory and other elements, and may include any suitable combination of hardware, firmware and other hard-wired, programmed or configured circuitry. The turbo decoder 500 shown in FIG. 5 can be embodied as an integrated circuit chip or portion of a chip (not shown). Such a chip can be used in storage devices such as disk drives, communication devices, and other devices that involve communication of data over a channel, as known in the art. Still other embodiments of the invention can comprise any other suitable arrangement of hardware, firmware, software or combination thereof.

The logic and other elements perhaps most relevant to the present invention include, in addition to branch metric (gamma) calculation logic 400, interleaver and de-interleaver memory (referred to collectively as "interleaver memory") element 502, and the multiply-by-two logic (e.g., a bit-shifter) 504 and divide-by-two logic 506 coupled to the output and input of interleaver memory 502, respectively, that compensate for the absence of divide-by-two normalization in branch metric calculation logic 400. Stated another way, the multiply-by-two logic 504 compensates for the storage of extrinsic values that have been reduced in magnitude by a factor of two (i.e., by one bit) by divide-by-two logic 506. This divide-by-two operation is mathematically equivalent in the context of the overall turbo decoding algorithm to the divide-by-two operation performed at the output of the prior art branch metric calculation logic 300, but by removing it from that calculation and performing it on the extrinsic value prior to storage in interleaver memory 502, memory storage requirements are reduced by one bit per extrinsic value. For example, a turbo decoder in accordance with the present invention that stores on the order of 5,000 5-bit extrinsic values requires approximately 16% less interleaver memory than a prior turbo decoder that stores the same number of 6-bit extrinsic values. Collectively, interleaver memory 502, multiply-by-two logic 504 and divide-by-two logic 506 coupled to the output and input of interleaver memory 502, respectively, define an interleaver memory system.

In addition, as noted above, removing the divide-by-two operation from the branch metric calculation increases decoder sensitivity to some extent. As described above with regard to the comparison of FIGS. 3 and 4 with each other, in prior turbo decoders, the result of the branch metric calculation is one-half the result of the branch metric calculation in turbo decoder 500 of the invention. In other words, prior turbo decoders effectively throw away the least significant bits of the received samples $R_s$ and $R_p$, whereas turbo decoder 500 retains these bits. This difference results in the present invention providing improved responsiveness to the received samples $R_s$ and $R_p$.

The remaining logic and other elements of turbo decoder 500 are essentially as in a conventional turbo decoder and include: gamma memory elements 508 and 510 that are used by branch metric calculation logic 400; alpha calculation logic 512 and associated memory element 514, which perform or effect the above-noted Step 3B of the method; beta calculation logic 516, which performs or effects Step 4B; log likelihood "0" bit logic 518 and log likelihood "1" bit logic 520, which perform or effect Steps 5B and 6B, respectively; and log likelihood ratio (LLR) logic 522, which performs or effects Step 7B. Also included are various conventional logic elements associated with the above and arranged in the conventional manner, such as a delay element 524 coupled to the output of interleaver memory element 502, a clamp element 526 coupled to the input of interleaver memory 502 (via divide-by-two logic 506), a quantizer element 528 that transforms the output of LLR logic 522 into hard decisions to store in an output memory buffer 530 that buffers the decoded symbols. It can be noted that these elements, excluding interleaver memory element 502, together implement the conceptual SISO decoders 202 and 204 shown in FIG. 2.

Additional elements that have been conventionally included in turbo decoders include interleaver address generation logic 532 and delay logic 534 that provides the generated addresses in a delayed fashion to interleaver memory element 502 to properly address the extrinsic values for storage and retrieval. As persons skilled in the art understand, addresses in successive iterations are alternately linear and interleaved. Symbol input buffer logic 536 can also be provided in the conventional manner. Although some of these elements are shown in simplified form, and although details of interleaver addressing, timing and other design matters with which persons skilled in the art will be familiar are omitted for purposes of clarity, such persons will readily be capable of making and using a turbo decoder 500 and other embodiments of the present invention in view of the teachings herein.

Figure 6:
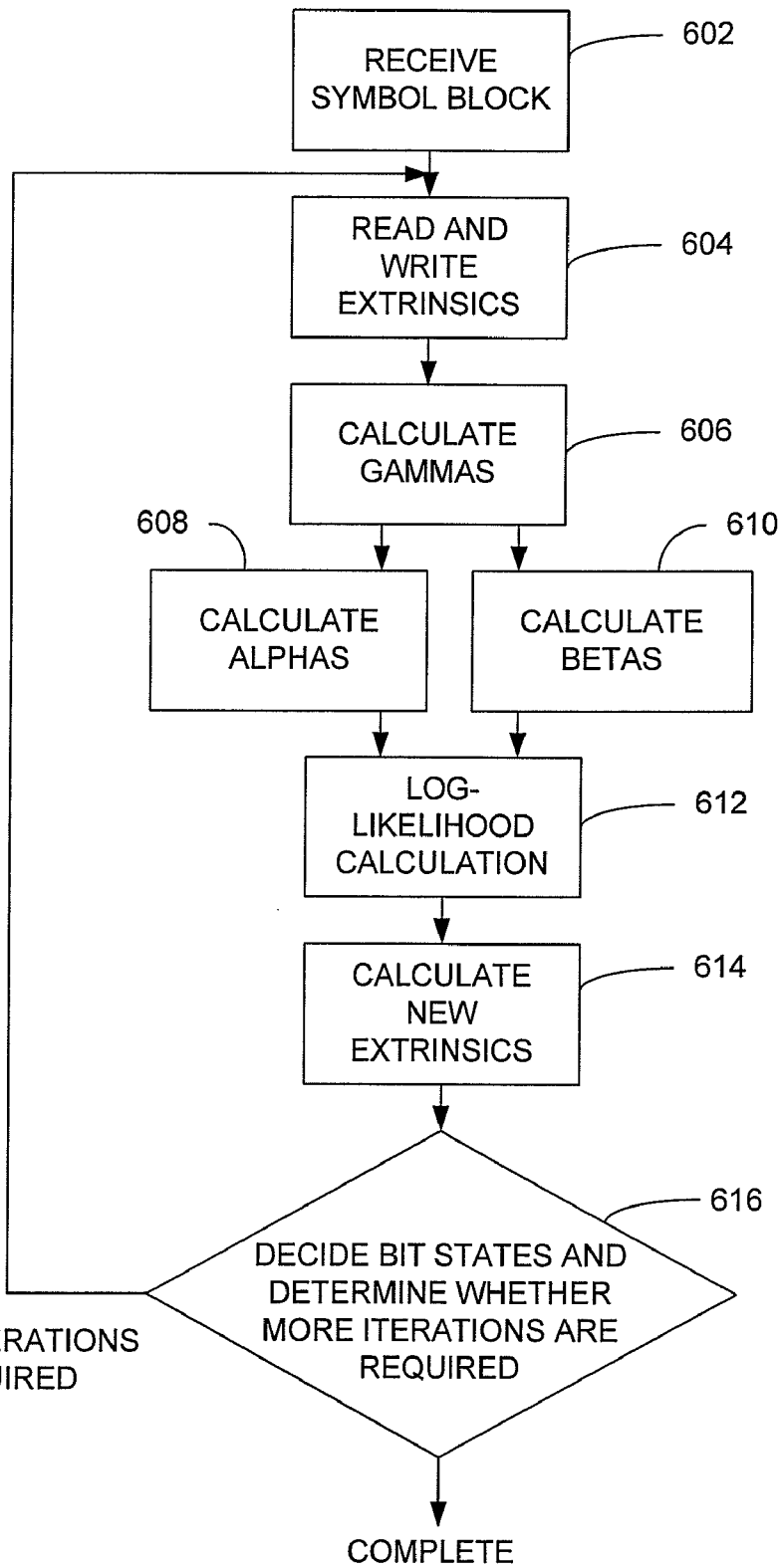
FIG. 6 is a flow diagram of a turbo decoding method in accordance with the exemplary embodiment.

The above-described turbo decoding method is summarized in the flow diagram of FIG. 6. At step 602, a symbol block is received. At step 604, previously calculated extrinsic values are read from interleaver memory. At step 606, the (non-normalized) branch metric values are produced in response to previously calculated extrinsic values read from the interleaver memory and received symbol information. Note that as part of step 604, the normalization factor (that would conventionally have been applied in the equivalent of step 606 in prior turbo decoding methods) is applied to the newly calculated extrinsic values before they are written to interleaving memory. At step 608, the trellis is recursively traversed in a forward time direction to produce alpha probabilities of each state in the trellis. At step 610, the trellis is recursively traversed in a reverse time direction to produce beta probabilities of each state in the trellis. At step 612, a log-likelihood ratio is calculated in response to the alpha probabilities, beta probabilities, and non-normalized branch metric values. At step 614, newly calculated extrinsic values are provided in response to the difference of the log-likelihood ratios and the previously calculated extrinsic values, and the newly calculated extrinsics are written to the interleaver memory.

As described above, the inverse of the normalization factor is applied to the previously calculated extrinsic values before calculating this difference and the new extrinsic is normalized before being written to the interleaver memory. Lastly, at step 616, bit states are decided in response to the corresponding log-likelihood ratios and a decision is made as to whether more iterations are required. The bit states represent the output or result of the turbo decoding method. Processing continues in an iterative style around the loop until no more iterations are deemed required, at which point the decoding process is complete.

It will be apparent to those skilled in the art, in view of the description provided herein, that various modifications and variations can be made to this invention without departing from the spirit or scope of the invention. Thus, it is intended that the present invention cover all such modifications and variations of this invention, provided that they come within the scope of one or more of the claims. Also, although it is believed that decoders in accordance with the present invention would, under the current lexicon in the art, be classified as types of turbo decoders, the term "turbo decoder" as used in this specification is not intended to be limiting. With regard to the claims, no claim is intended to invoke the sixth paragraph of 35 U.S.C. Section 112 unless it includes the term "means for" followed by a participle.

What is claimed is:

1. A memory system for manipulating extrinsic values in a turbo decoder, comprising:
   interleaving memory; and
   memory system control logic, the memory system control logic applying a normalization factor to newly calculated extrinsic values before they are written to interleaving memory and applying an inverse of the normalization factor to previously calculated extrinsic values after they are read from interleaving memory.

2. The memory system claimed in claim 1, wherein the normalization factor is one-half, and the memory system control logic divides the newly calculated extrinsic values by two before they are written to interleaving memory and multiplies the previously calculated extrinsic values read from interleaving memory by two.

3. A method for manipulating extrinsic values in a turbo decoder having non-normalizing branch metric value (gamma) calculation logic and interleaving memory, comprising the steps of:
- applying a normalization factor to newly calculated extrinsic values before they are written to interleaving memory; and
- applying an inverse of the normalization factor to previously calculated extrinsic values after they are read from interleaving memory;
- wherein the branch metric value calculation logic does not normalize calculated branch metric values.

4. The method claimed in claim 3, wherein the normalization factor is one-half, and wherein:
- the step of applying a normalization factor comprises dividing the newly calculated extrinsic values by two before they are written to interleaving memory; and
- the step of applying an inverse of the normalization factor comprises multiplying the previously calculated extrinsic values read from interleaving memory by two.

* * * * *